United States Patent [19]
Takishima et al.

[11] Patent Number: 5,883,589
[45] Date of Patent: Mar. 16, 1999

[54] VARIABLE LENGTH CODE CONSTRUCTION APPARATUS

[75] Inventors: Yasuhiro Takishima; Shigeyuki Sakazawa, both of Tokyo; Masahiro Wada, Kanagawa, all of Japan

[73] Assignee: Kokusai Denshin Denwa Co., Ltd., Tokyo, Japan

[21] Appl. No.: 803,441

[22] Filed: Feb. 20, 1997

[30] Foreign Application Priority Data

Feb. 23, 1996 [JP] Japan ................................. 8-060295

[51] Int. Cl.⁶ .................................................. H03M 7/40
[52] U.S. Cl. ............................................. 341/67; 341/65
[58] Field of Search .................................... 341/65, 67

[56] References Cited

U.S. PATENT DOCUMENTS

| | | | |
|---|---|---|---|
| 4,146,909 | 3/1979 | Beckenhauer et al. | 360/39 |
| 4,990,910 | 2/1991 | Takishima et al. | 341/67 |
| 5,077,760 | 12/1991 | Lepage | 375/116 |
| 5,091,971 | 2/1992 | Ward et al. | 382/54 |
| 5,396,595 | 3/1995 | Standley | 395/250 |
| 5,488,367 | 1/1996 | Kitamura | 341/106 |
| 5,528,628 | 6/1996 | Park et al. | 375/240 |

*Primary Examiner*—Marc S. Hoff
*Assistant Examiner*—Jason L.W. Kost
*Attorney, Agent, or Firm*—Nikaido, Marmelstein, Murray & Oram LLP

[57] ABSTRACT

An apparatus for constructing a variable length code includes a unit for producing a unique word consisting of continuous N "0" bits, a prefix processing unit for producing a codeword including at least one "1" bit, the prefix of the codeword having continuous "0" bits with a length equal to or shorter than s, and a suffix processing unit for modifying a bit pattern of the produced codeword from the prefix processing unit so that the suffix of the codeword has continuous "0" bits with a bit length equal to or shorter than t, that a bit length of continuous "0" bits in the codeword is shorter than N, and that s+t<N is satisfied.

10 Claims, 13 Drawing Sheets

HUFFMAN CODE ($C_{10}$)

PREFIX—PROCESSED VLC ($C_{11}$)

□: ADDITIONAL BIT "1"
△: CONJUGATE IMAGINARY LEAF

EMULATION-LESS VLC ($C_{12}$)
s=2, t=0, N=3

VARIABLE LENGTH CODE CONSTRUCTION APPARATUS

FIELD OF THE INVENTION

The present invention relates to an apparatus, provided in a signal transmission system using binary code, for constructing a variable length code (VLC) with no unique-word emulation.

DESCRIPTION OF THE RELATED ART

In general, a binary coded digital signal transmission system mostly utilizes VLC such as Huffman code so as to establish a high efficiency reversible coding. Also, in most cases, the binary signal transmission system may accompany with synchronization recovery and error correction techniques to increase its endurance against possible propagation and storage errors. Especially, a unique word with a unique pattern of bits is used to reduce influence of possible propagation error onto the decoded image. This unique word is used for example in the international standard for image signal coding.

A coded bit stream consisting of many VLCs may cause to lose the codeword synchronization due to the propagation errors and therefore invite continuous decoding errors. However, by inserting a unique word in a coded bit stream periodically in synchronization with the picture structure, for example in the head of every "slice" in the every picture frame, which is a part of picture frame with a slice-shape, the damage or the decoding error will be held to a minimum in the space up to the next unique word.

It is necessary that a unique word has a unique pattern of bits among (no emulation with) all the codewords involved and any combinations of the codewords so as to be correctly recognized in any situation (for any transmitted pattern of symbols and of distortions) except for the case wherein the unique word itself presents errors.

Thus, when selecting VLC codewords, it needs to consider that no combination of the codewords emulates a unique word. However, since there has no systematic method to create VLCs which guarantee this no emulation with respect to the unique word, experimental methods have been used to establish sets of VLCs heuristically for example by forbidding several codewords or by inserting maker bits into appropriate locations to avoid specific bit patterns, and much effort has been made to verify the uniqueness of the unique word among the constructed VLCs.

SUMMARY OF THE INVENTION

It is therefore an object of the present invention to provide a VLC construction apparatus, whereby emulation-less VLCs ensuring use of a unique word with a unique bit pattern can be systematically obtained with an improved code efficiency.

According to the present invention, an apparatus for constructing a variable length code includes a unit for producing a unique word consisting of continuous N "0" bits (N is a natural number more than 1), a prefix processing unit for producing a codeword including at least one "1" bit, the prefix of this codeword having continuous "0" bits with a length equal to or shorter than s (s is a natural number or zero), and a suffix processing unit for modifying a bit pattern of the produced codeword from the prefix processing unit so that the suffix of the codeword has continuous "0" bits with a bit length equal to or shorter than t (t is a natural number or zero), that a bit length of continuous "0" bits in the codeword is shorter than N, and that s+t<N is satisfied.

Conditions of a unique word and requirements for VLC structure for construction of an emulation-less VLC will be now described.

To simplify, it is assumed that the unique word shall have following feature.

(Condition 1) Only one kind of unique word is used.
(Condition 2) The unique word is composed of only "0" bits.

The Condition 1 is significant to simplify the construction of the VLCs, but it does not limit the usage of the unique word. When two or more kinds of unique words (synchronization words) are necessary, the single kind of unique word can be used as an escape codeword and extension words corresponding to the various kinds of unique words (synchronization words) can follow it. The Condition 2 is valid considering that it is easy for practical hardware to detect continuous "0" bits in a bit stream, and it is also significant for simplifying the construction of the VLCs. The bit length of the unique words is denoted as N.

The requirements for construction of an emulation-less VLC depend on attributes of the unique word and on the transmitted pattern of VLC sets (not to the transmitted pattern of codeword in every code). The most basic transmission system is single-code transmission with an infinite loop. In this system, a set of codeword with one code book is transmitted continuously. The use of each codewords is governed only by its occurrence probability.

In this system, requirements for the codewords are as follows.

(Requirement 1) Codewords consisting of only "0" bits shall be prohibited.
(Requirement 2) The maximum length of continuous "0" bits in the prefix of each codeword shall be equal to or shorter than S.
(Requirement 3) The maximum length of continuous "0" bits in the suffix of each codeword shall be equal to or shorter than t.
(Requirement 4) s+t<N
(Requirement 5) The maximum length of continuous "0" bits in the middle of each codeword shall be shorter than N.

The Requirement 1 is essential to prevent a series of an identical codeword from emulating the unique word. The Requirements 2, 3 and 4 are required to prevent combinations of two codewords from emulating the unique word. The Requirement 5 is necessary for a long codeword not to include the unique word therein. The necessary and sufficient condition to obtain an emulation-less VLC is to simultaneously satisfy this sets of the Requirements 1 to 5. The aforementioned apparatus according to the present invention can achieve these Requirements 1 to 5. In other words, according to the present invention, VLC which does not emulate a unique word having a special pattern of bits can be systematically constructed.

It is preferred that the prefix processing unit consists of a unit for producing a variable length code by introducing a dummy word consisting of only continuous s+1 "0" bits.

It is also preferred that the prefix processing unit includes a unit for producing the dummy word with an occurrence probability of $P_d$, a unit for modifying an occurrence probability of each word $P_i$ in accordance with the occurrence probability $P_d$ to provide a modified occurrence probability $\tilde{P}_i$, and a unit for deciding bit patterns of all the codewords by using a variable length code algorithm based upon the occurrence probability $P_d$ and the modified occurrence probability $\tilde{P}_i$.

It is preferred that the suffix processing unit includes a unit for measuring a suffix status of each codeword, and a unit for providing a codeword with no additional bit when the continuous length of "0" bits in the suffix of the codeword is equal to or shorter than t and also the codeword does not have consecutive N−1 "0" bits.

Preferably, the suffix processing unit includes a unit for inserting additional bits of "1" after consecutive "0" bits when the continuous length of "0" bits in the middle of the codeword is N−1 "0" bits.

It is preferred that the suffix processing unit further includes a unit for inserting additional bits of "1" when the continuous length of "0" bits in the suffix of the codeword is longer than t.

Preferably, the suffix processing unit consists of a unit for measuring parameters expressed in a binary tree and a unit for modifying the bit pattern of the produced codeword.

It is preferred that the apparatus further includes a parameter optimization unit for modifying parameters s and t to an optimized values which improve code efficiency.

It is also preferred that the parameter optimization unit includes a unit for measuring an average code length of variable length codes output from the suffix processing unit and number of additional bits inserted by the suffix processing unit, and a unit for modifying the parameters s and t according to the measured average code length and number of additional bits.

It is preferred that the apparatus further includes a unit for producing a fixed length code in which a codeword includes at least one "1" bit, the prefix of the codeword has continuous "0" bits with a length equal to or shorter than s, the suffix of the codeword has continuous "0" bits with a bit length equal to or shorter than t, a bit length of continuous "0" bits in the codeword is shorter than N, and s+t<N is satisfied.

Further objects and advantages of the present invention will be apparent from the following description of the preferred embodiments of the invention as illustrated in the accompanying drawings.

DESCRIPTION OF THE PREFERRED EMBODIMENTS

Figure 1:
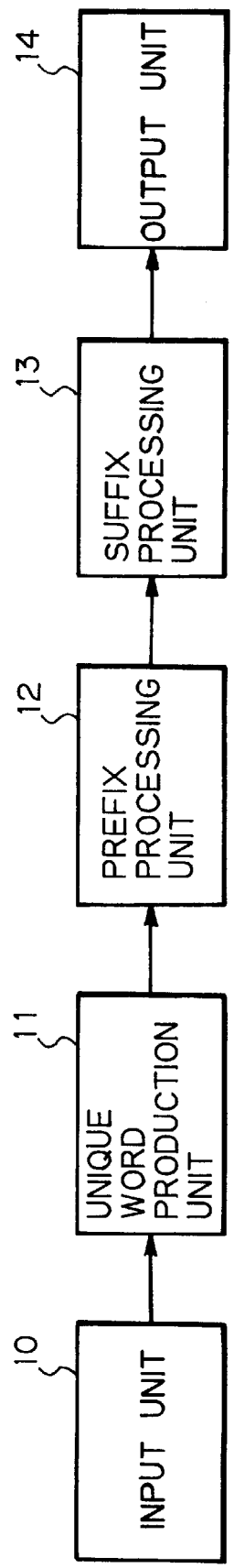
FIG. 1 is a block diagram schematically showing a preferred embodiment of a VLC construction apparatus according to the present invention.

Referring to FIG. 1 which schematically shows a preferred embodiment of a VLC construction apparatus according to the present invention, reference numeral 10 denotes an input unit for receiving number of symbols n, an occurrence probability of each symbol $P_i$, a unique word length N (N is a natural number more than 1), number of kinds of the unique word E, and internal process parameters s and t. To this input unit 10, a unique word production unit 11, a prefix processing unit 12, a suffix processing unit 13 and an output unit 14 for providing a constructed VLC and a unique word are sequentially connected in this order.

Figure 2:
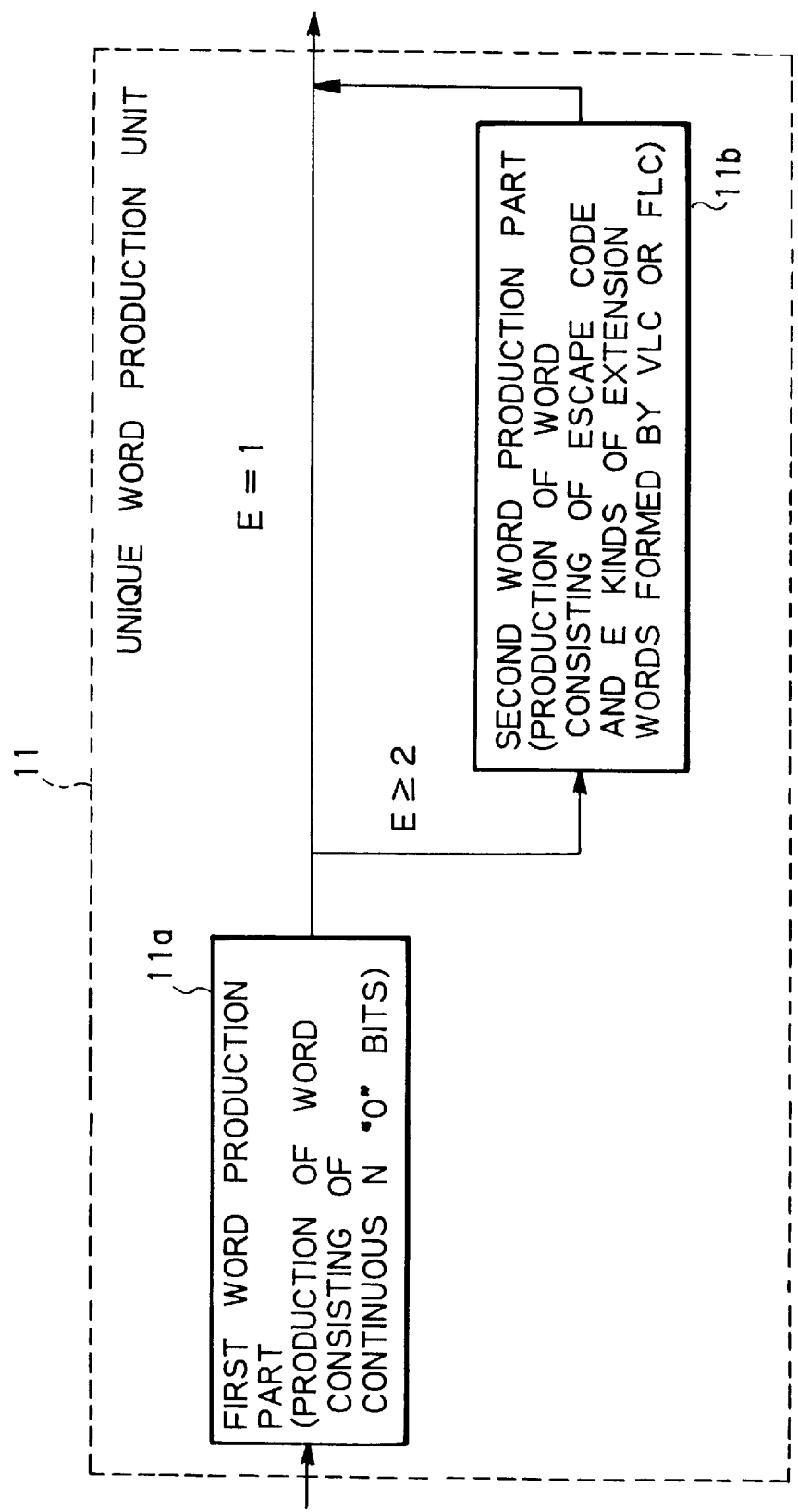
FIG. 2 is a block diagram schematically showing a configuration example of a unique word production unit according to the embodiment of FIG. 1.

The unique word production unit 11 has, as shown in FIG. 2, a first word production part 11a for providing a single kind of word consisting of continuous N "0" bits, and a second word production part 11b for providing E kinds of extension words constituted by VLC or fixed length code (FLC). When a single kind of unique word only is requested (when E=1), the word of continuous N "0" bits produced at the first word production part 11a is output as the unique word. When a plurality of kinds of unique words are requested (when E≧2), unique words each of which is formed, at the second word production part 11b, by an escape code consisting of the above-mentioned single unique word produced at the first word production part 11a and by one of extension codes of VLC or FLC following to the escape code.

Figure 3:
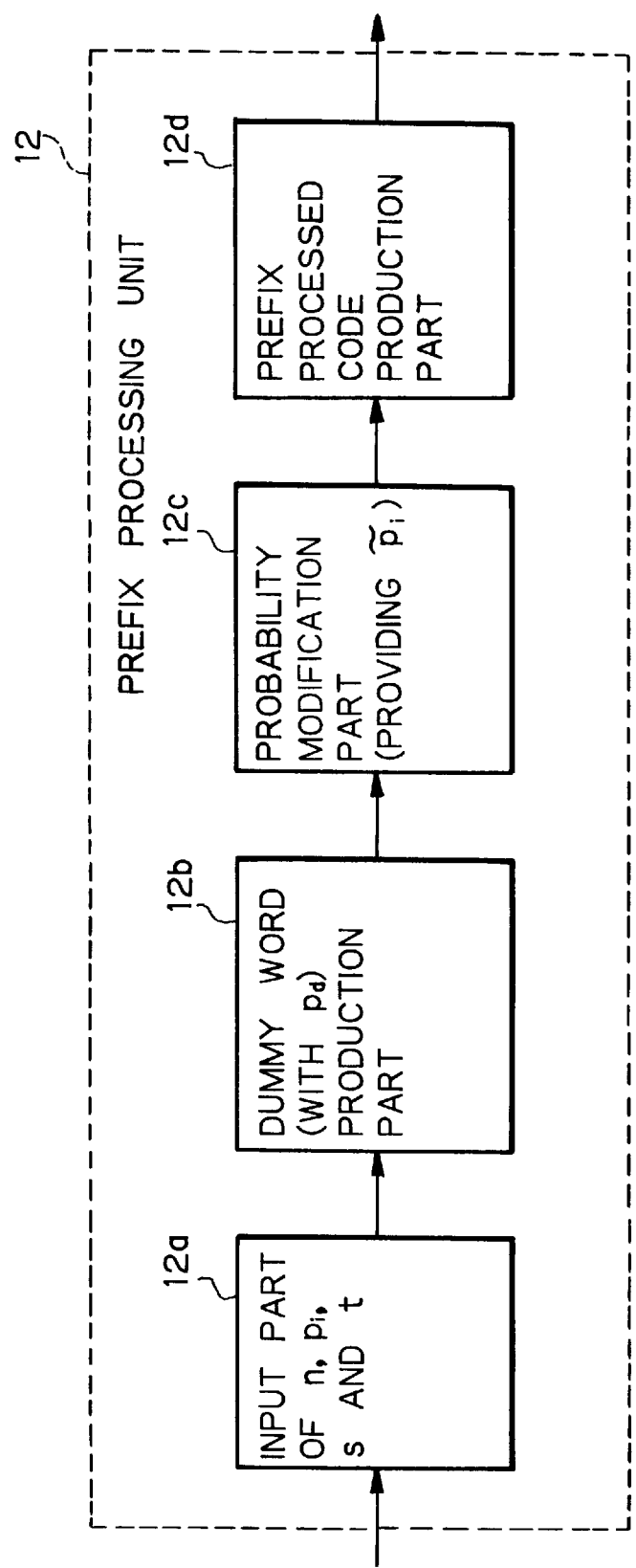
FIG. 3 is a block diagram schematically showing a configuration example of a prefix processing unit according to the embodiment of FIG. 1.

The prefix processing unit 12 has, as shown in FIG. 3, an input part 12a for receiving the number of symbols n, the occurrence probability of each symbol $P_i$, a parameter s (a natural number defining the maximum prefix 0-length in the codeword) and a parameter t (a natural number defining the maximum suffix 0-length in the codeword), a dummy word production part 12b for producing a dummy word consisting of only continuous s+1 "0" bits and having a virtual occurrence probability of $P_d$, a probability modification part 12c for modifying the probability of each word $P_i$ to $\tilde{P}_i$, and a prefix processed code production part 12d for deciding bit pattern of all the codewords by using a variable length coding algorithm based upon the probability $P_d$ and the modified probability $\tilde{P}_i$.

The aforementioned Requirements 1 and 2 for VLC are satisfied at the same time by prefix-processing. This processing is made possible by introducing a dummy word consisting of continuous s+1 "0" bits. When a dummy word with this feature is included in a set of codewords, it is apparent that all the other codewords can satisfy the Requirements 1 and 2 because of the prefix condition which is a premise of the VLC structure. Some efficiency loss due to using of the dummy word may be accompanied. It should be noted that the dummy word is used only for creation of the other words with appropriate bit patterns and is never practically used for signal transmission.

Assuming a virtual probability corresponding to the dummy word shall be $P_d$, the probability for deciding each word is modified to $\tilde{P}_i$ from its original probability $P_i$ by the conversion:

$$\tilde{P}_i = P_i \times (1-P_d) \quad \text{(Equation 1)}$$

where $1 \leq i \leq n$ and n indicates the total number of codewords (the number of symbols) except for the dummy word. Codewords are assigned to all the symbols including the dummy symbol according to the probability corresponding to the dummy word $P_d$ and the modified probability $\tilde{P}_i$ by an ordinary procedure to construct a VLC such as the Huffman algorithm. An example of an original occurrence probability, a modified probability, a Huffman code $C_{10}$ for reference which is obtained from the original occurrence probability and a prefix-processed VLC $C_{11}$ satisfying the Requirements 1 and 2, of each symbol and of the dummy symbol, and average code lengths of each codeword are shown in Table 1. In this example, the probability of the dummy word $P_d$ is set to $P_d = 0.125$, which makes the length of the dummy word to 3 (s=2, t=0, N=3).

TABLE 1

| symbol | occurance probability | modified probability | Huffman code ($C_{10}$) | Prefix-processed VLC ($C_{11}$) | Emulation-less VLC ($C_{12}$) |
|---|---|---|---|---|---|
| A | 0.400 | 0.3500 | 1 | 01 | 01 |
| B | 0.264 | 0.2310 | 01 | 10 | 11 |
| dummy | — | 0.1250 | — | 000 | 000 |
| C | 0.056 | 0.0490 | 00000 | 1100 | 1011 |
| D | 0.052 | 0.0455 | 00001 | 1101 | 0011 |
| E | 0.048 | 0.0420 | 00010 | 1110 | 1010A |
| F | 0.044 | 0.0385 | 00011 | 1111 | 0010A |
| G | 0.040 | 0.0350 | 00100 | 00100 | 100A01 |
| H | 0.036 | 0.0315 | 00101 | 00101 | 100A11 |
| I | 0.032 | 0.0280 | 00110 | 00110 | 100A00A |
| J | 0.028 | 0.0245 | 00111 | 00111 | 100A10A |
| average code length | | | 2.608 | 2.808 | 3.096 | s = 2, t = 0, N = 3
A: additional bit "1"

The value of $P_d$ which provides a desired value of s can be approximately given by:

$$P_d \approx 1 / 2^{s+1} \quad \text{(Equation 2)}$$

considering that the entropy of a symbol with probability P is expressed as $-\log_2 P$. When the obtained length of the dummy word is longer than s+1, a $P_d$ larger than $1 / 2^{s+1}$ should be selected and thus codewords will be assigned correctly. Contrary to this, a shorter length than s+1 needs modification by a $P_d$ smaller than $1 / 2^{s+1}$.

In an another embodiment according to the present invention, the optimization of the value s will be executed. The range of s is limited as $$0 \leq s \leq L_{max} \quad \text{(Equation 3)}$$

where $L_{max}$ is the maximum length of codewords of a VLC constructed without the dummy word and denoted as a reference code, and $$\lim_{P_d \to 1} s = 0 \quad \text{(Equation 4)}$$

$$\lim_{P_d \to 0} s = L_{max}. \quad \text{(Equation 5)}$$

Figure 4:
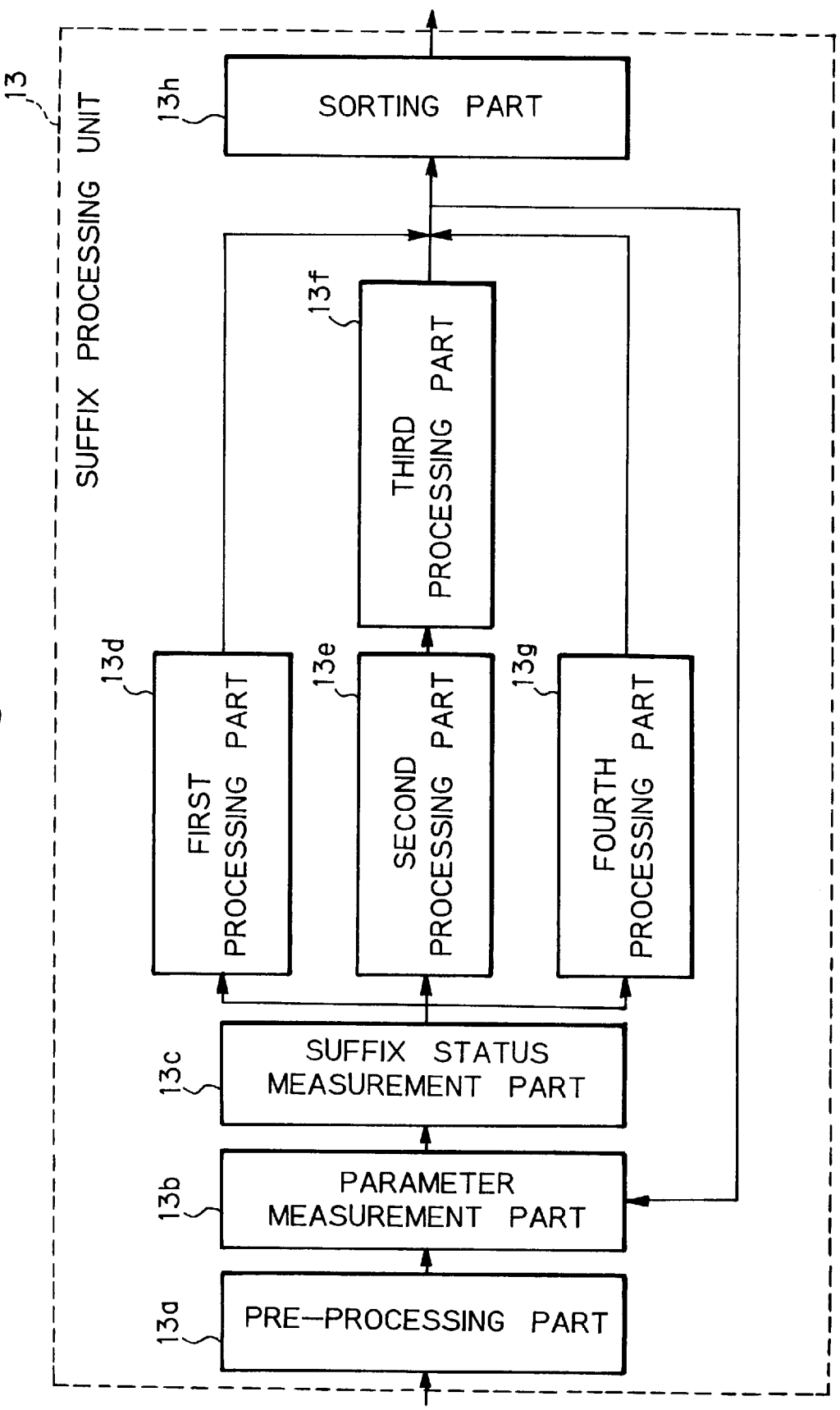
FIG. 4 is a block diagram schematically showing a configuration example of a suffix processing unit according to the embodiment of FIG. 1.

The suffix processing unit 13 has, as shown in FIG. 4, a pre-processing part 13a for pre-processing each codeword so that as much codewords equal to or shorter than t as possible will be terminated by "0" bit, a parameter measurement part 13b for measuring parameters expressed in a binary tree at all the levels, a suffix status measurement part 13c for measuring a suffix status of each codeword, a first processing part 13d for inserting no additional bit when the continuous length of "0" bits in the suffix of the codeword is equal to or shorter than t, second and third processing parts 13e and 13f for inserting additional bits of "1" after consecutive "0" bits when the continuous length of "0" bits in the middle of the codeword is N-1 "0" bits, a fourth processing part 13g for inserting additional bits of "1" when the continuous length of "0" bits in the suffix of the codeword is longer than t, and a sorting part 13h for sorting symbols according to the occurrence probabilities after processing of all levels.

Figure 5:
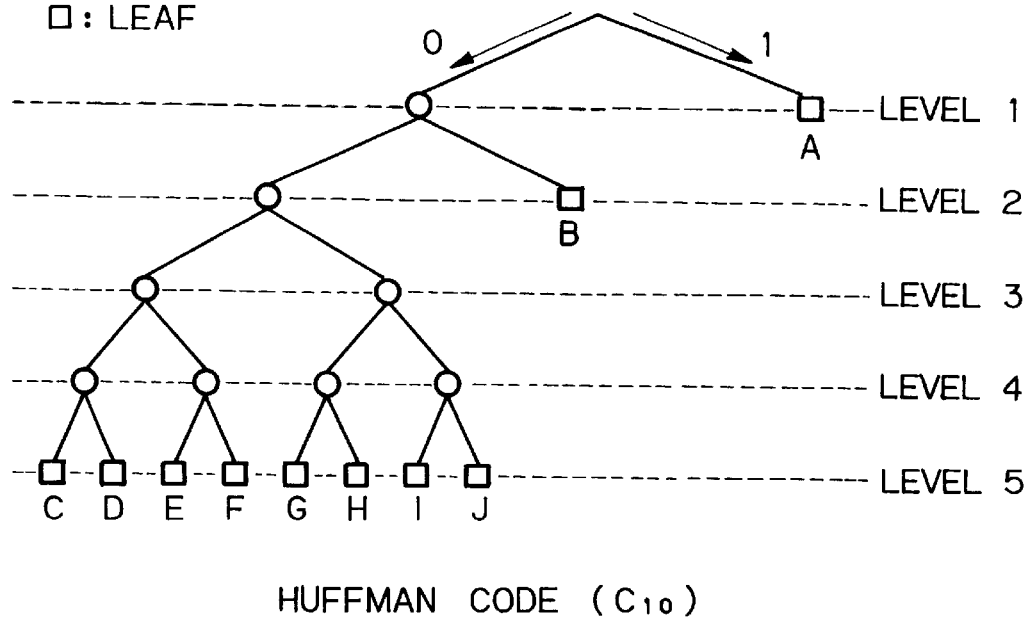
FIG. 5 illustrates a tree structure of Huffman code ($C_{10}$) of each symbol shown in Table 1.
Figure 6:
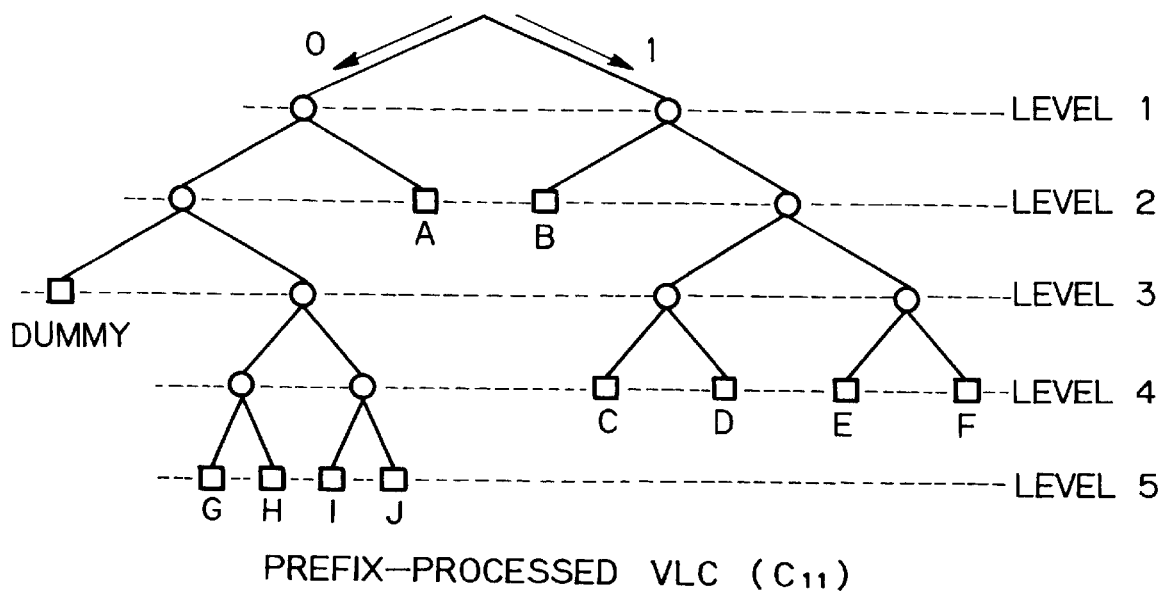
FIG. 6 illustrates a tree structure of prefix-processed VLC ($C_{11}$) of each symbol shown in Table 1.

In this suffix processing unit 13, the VLC produced in the prefix processing unit 12 is modified by investigating the suffix of each codeword and by changing the bit pattern or by inserting additional bit(s) of "1" if necessary to satisfy the aforementioned Requirements 3, 4 and 5. This process can be performed by making use of a binary tree expression for a code. For example, the Huffman code $C_{10}$ and the prefix-processed VLC $C_{11}$ have the expressions shown in FIGS. 5 and 6, respectively. In the figures, a leaf corresponds to an end of a codeword, while a node corresponds to a middle position of codewords.

The suffixes of all the leaves and nodes are checked as to whether they need additional bits or not. Since up to t consecutive bits of "0" are allowed as a leaf suffix, it is necessary to investigate, for each leaf, the situation of nodes at t levels above the level to which bits are added.

The investigation and bit addition procedure is performed as follows.

(1) In the pre-processing part 13a, it is made that as many codewords as possible that are shorter than or equal to t are terminated by "0". This can be carried out by making use of the known equivalent transform technique which exchanges nodes or leaves at the same level without changing average code length. This pre-processing is effective for reducing a continuous length of "0" bits in the suffix of a longer word.

(2) In the parameter measurement part 13b, parameters of the tree structure are measured at all the levels:

$n_i$: number of leaves at level i $r_i$: total number of nodes and leaves at level i where $0 < i < \tilde{L}_{max}$, $\tilde{L}_{max}$ is the length of the longest codeword, and $$r_i = 2^i - \sum_{j=1}^{i-1} (2^{i-j} \times n_j). \quad \text{(Equation 6)}$$

(3) In the suffix status measurement part 13c, parameters providing a suffix status at level i (i>t) are measured:

$m_i$: number of leaves with a bit "0" at the bottom at level i $u_{i-t-1,j}$: total number of nodes and leaves with continuous j "0" bits from level i-t-1 where $$u_{i-t-1,1} = r_{i-t}/2 \quad \text{(Equation 7)}$$

and $$u_{i-t-1,j+1} = u_{i-t-1,j} - m_{i-t-1+j} \quad (0 < j < t) \quad \text{(Equation 8)}$$

(4) In the first processing part 13d, the following process is executed.

If $m_{i-t-1+j} \geq u_{i-t-1,j}$ j:0<j≦t, no additional bit is necessary at level i. There is no node or leaf which has more than t consecutive "0" bits at level i. Codewords at this level are reassigned to symbols so that nodes with long consecutive "0" bits are terminated at this level as leaves. Conversion of the tree structure is performed by the equivalent transform. If $$n_i \leq r_{i-t}/2, \, m_i = n_i. \quad \text{(Equation 9)}$$

Otherwise $$m_i = r_{i-t}/2. \quad \text{(Equation 10)}$$

(5) In the second processing part 13e, the following process is executed.

If $m_{i-t-1+j} < u_{i-t-1,j}$ j:0<j≦t and $n_i \leq r_i - u_{i-t-1,t+1}$, no additional bit is necessary at level i. There are nodes and leaves which have more than t consecutive "0" bits at level i. Codewords at this level are reassigned to symbols so that nodes with long consecutive "0" bits other than those with more than t consecutive "0" bits are terminated at this level as leaves. Conversion of the tree structure is performed by the equivalent transform. If $$n_i \leq r_{i-t}/2 - u_{i-t-1,t+1}, \, m_i = n_i. \quad \text{(Equation 11)}$$

Otherwise $$m_i = r_{i-t}/2 - u_{i-t-1,t+1}. \quad \text{(Equation 12)}$$

(6) In the third processing part 13f, the following process is executed.

Figure 7:
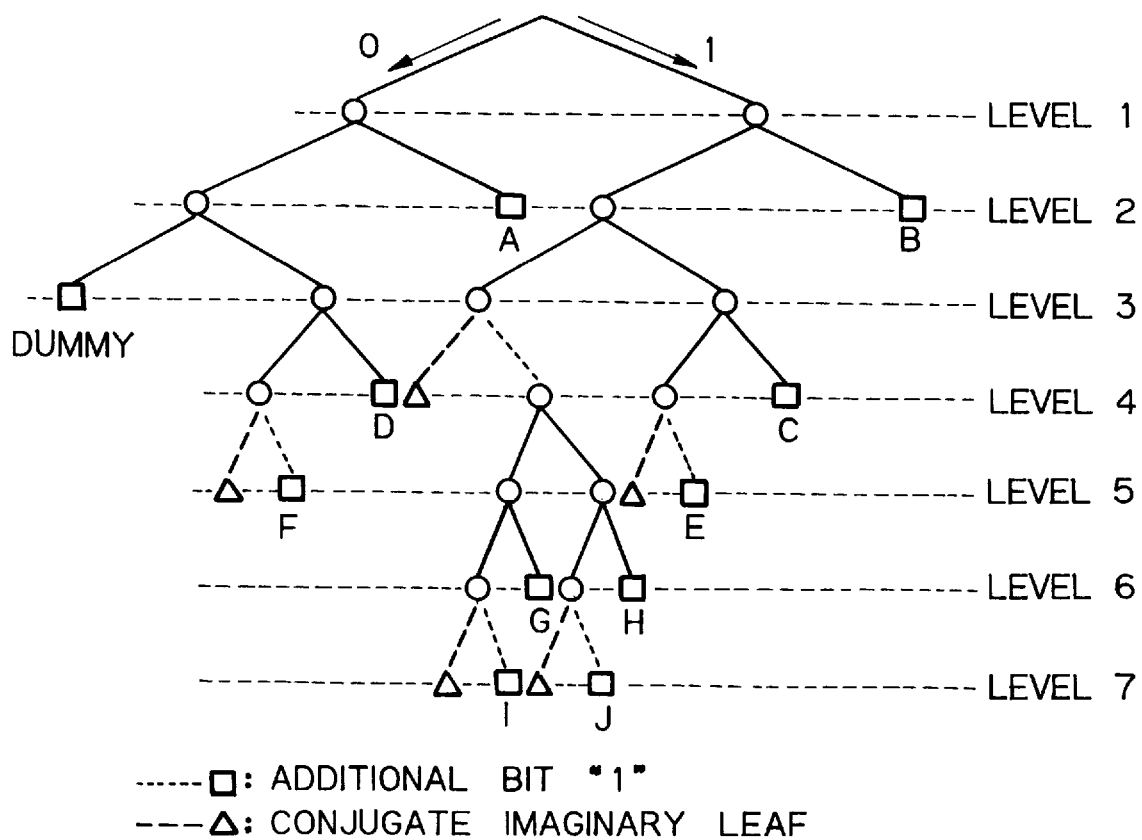
FIG. 7 illustrates a tree structure of emulation-less VLC ($C_{12}$) of each symbol shown in Table 1.

If there are some nodes among the remaining $r_i - n_i$ nodes whose suffixes have continuous "0" bits as long as N−1, "1" bits are inserted at this level. To maintain completeness of a code which is essential for the processing of lower levels, imaginary leaves that are at conjugate positions to the additional bits are produced (FIG. 7). Each of them has a bit "0" at the bottom and is fixed (not changed during the following equivalent transform operation). In this process, the equivalent transform for efficiency improvement is executed so that nodes with the smallest sum of probabilities of leaves at level i or levels lower than i are selected for addition of "1" bits. In this embodiment, additional bits are inserted to prevent three consecutive "0" bits at levels 4 and 7. This process satisfies the Requirement 5.

(7) In the fourth processing part 13g, the following process is executed.

If $m_{i-t-1+j} < u_{i-t-1,j}$ j:0<j≦t and $n_i < r_i - u_{i-t-1,t+1}$, as many as $n_i + u_{i-t-1,t+1} - r_i$ leaves require additional bits of "1". Additional bits are attached to the bottom of leaves from those with the longest continuous "0" bits in the suffix to those with the shortest "0" continuities. To maintain completeness of a code which is essential for the processing of lower levels, imaginary leaves that are at conjugate positions to the additional bits are produced (FIG. 7). Each of them has a bit "0" at the bottom and is fixed (not changed during the following equivalent transform operation). The parameter $n_i$ is modified as follows:

$$n_{i+1} = n_{i+1} + 2 \times (n_i + u_{i-t-1,t+1} - r_i). \quad \text{(Equation 13)}$$

In this process, the equivalent transform for efficiency improvement is executed so that nodes with the smallest sum of probabilities of leaves at level i or levels lower than i are selected for addition of "1" bits. In this embodiment, additional bits are inserted to prevent suffixes of consecutive "0" bits at level 5. This process satisfies the Requirements 3 and 4.

(8) Suffixes at the next level are investigated (i=i+1). At this level, the aforementioned processes (2) to (7) in the parameter measurement part 13b, the suffix status measurement part 13c, and the first to fourth processing parts 13d to 13g are repeated.

(9) In the sorting part 13h, after investigation of all levels, symbols are sorted according to the occurrence probabilities and reassigned to codewords according to their length. In this embodiment, code $C_{11}$ is converted to an emulation-less code $C_{12}$ shown in Table 1 and FIG. 7.

It should be noted that the equivalent transform does not handle, during the above-mentioned all processes, the dummy word, the reassigned and fixed words and the imaginary word.

Figure 8:
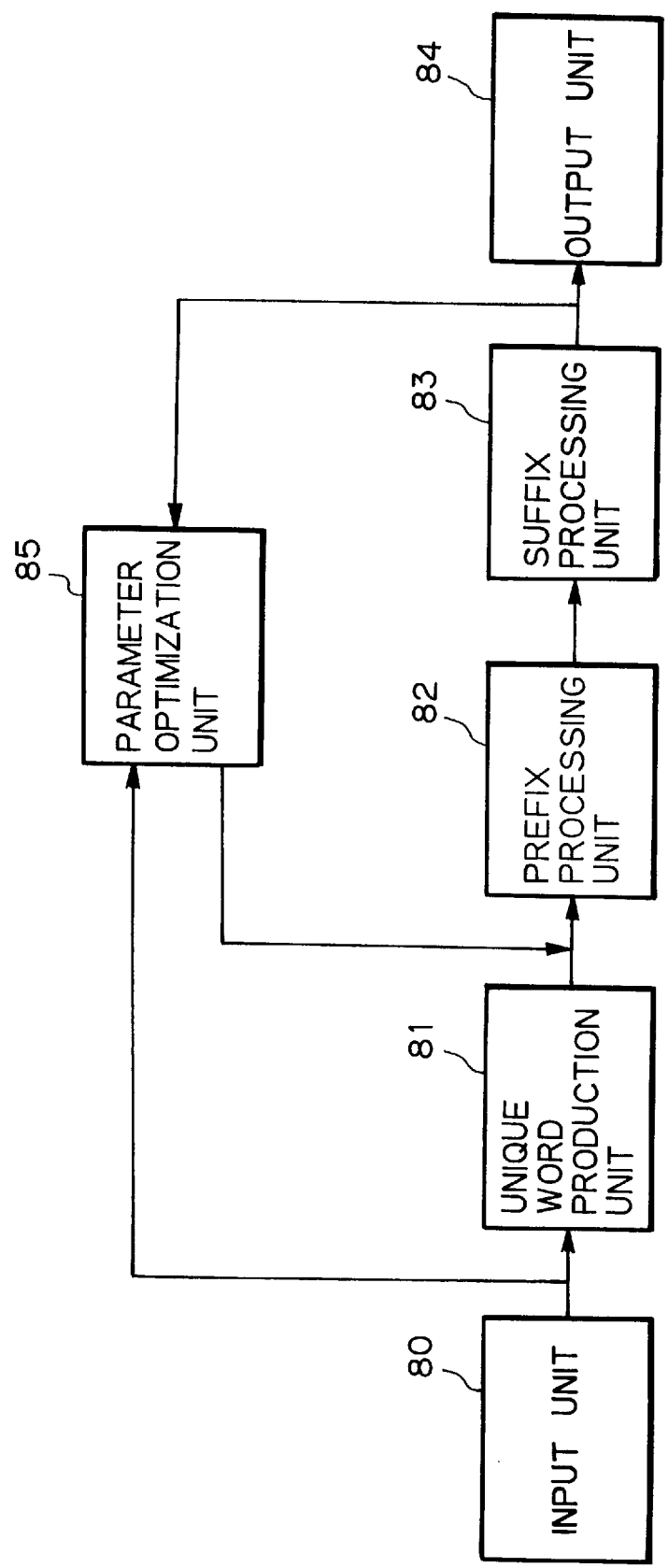
FIG. 8 is a block diagram schematically showing an another embodiment of a VLC construction apparatus according to the present invention.

FIG. 8 schematically shows an another embodiment of a VLC construction apparatus according to the present invention.

In the figure, reference numeral 80 denotes an input unit for receiving number of symbols n, an occurrence probability of each symbol $P_i$, a unique word length N (N is a natural number more than 1), and number of kinds of the unique word E. To this input unit 80, a unique word production unit 81, a prefix processing unit 82, a suffix processing unit 83 and an output unit 84 for providing a constructed VLC and a unique word are sequentially connected in this order. In this embodiment, the VLC construction apparatus additionally has a parameter optimization unit 85. This parameter optimization unit 85 receives outputs from the suffix processing unit 83 and the input unit 80, performs optimizing process with respect to parameters s and t so as to improve code efficiency of an emulation-less VLC, and provides the optimized parameter s and t to the prefix processing unit 82. Configurations of the unique word production unit 81, the prefix processing unit 82 and the suffix processing unit 83 are the same as those of the similar units in the embodiment shown in FIG. 1.

Figure 9:
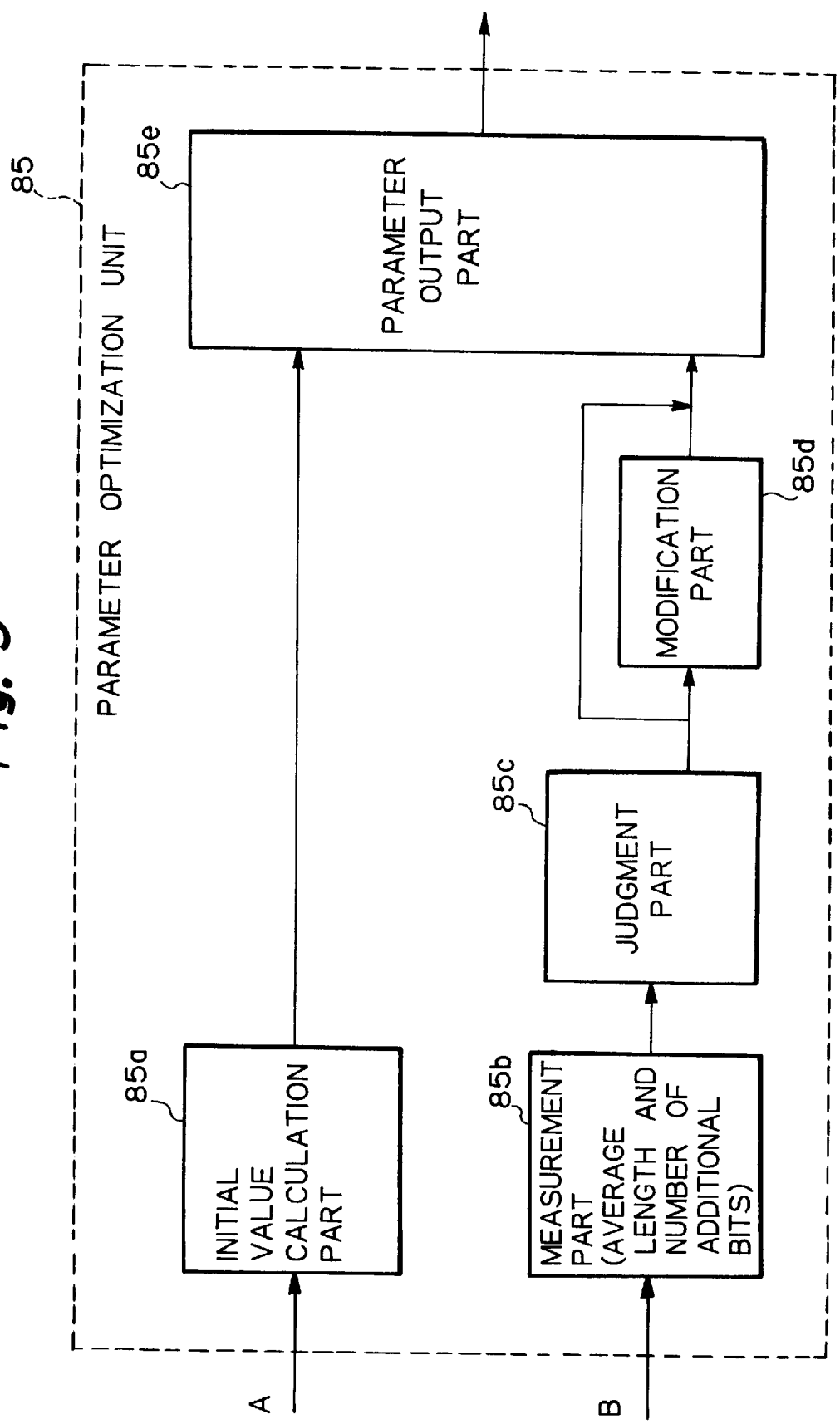
FIG. 9 is a block diagram schematically showing a configuration example of a parameter optimization unit according to the embodiment of FIG. 8.

As shown in FIG. 9, the parameter optimization unit 85 has an initial value calculation part 85a for calculating initial values of parameters s and t based upon the length of the unique word N (s+t<N), a measurement part 85b for measuring an average code length of VLC output from the suffix processing unit 83 and the number of additional bits inserted by the suffix processing unit 83, a judgment part 85c for judging whether the parameters s and t should be modified or not according to the measured average code length and the number of additional bits, a modification part 85d for modifying the parameters s and t if necessary, and a parameter output part 85e for providing the optimized parameters s and t to the prefix processing unit 82.

The judgment part 85c and the modification part 85d optimize the parameter s in accordance with the given parameter N (length of the unique word) so as to increase the value of the parameter s as large as possible without using any additional bit. To be concrete, the parameter s is modified to provide the minimum average code length as N−3≦s≦N−1 and thus the parameter t is obtained from the parameter s as t=N−1−s.

Hereinafter, the optimization procedure for the parameter s and t performed in the judgment part 85c and the modification part 85d of the parameter optimization unit 85 will be described in detail.

In this embodiment, an emulation-less code has efficiency loss when compared to a reference code with the minimum average code length, which is caused by introduction of the dummy word and additional bits in suffixes and in the middle of words. This efficiency loss can be formulated by parameters representing the code structure such as occurrence probabilities and number of codewords with "0" bits in their suffixes, as well as by parameters of the unique word such as s, t and N.

The efficiency loss caused by the dummy word is given as follows. Since the length of each codeword is given by an algorithm for producing a compact code based on the modified probability, the length is provided:

$$\tilde{l}_i \geq -\log_2 \tilde{p}_i \quad \text{(Equation 14)}$$
$$= -\log_2 p_i \times (1 - p_d)$$

where $\tilde{l}_i$ denotes the length of codeword i and $1 \leq i \leq n$. Therefore, $$\tilde{L}_{ave} = \sum_{i=1}^{n} p_i \times \tilde{l}_i \quad \text{(Equation 15)}$$
$$\geq -\left( \sum_{i=1}^{n} p_i \times \log_2 p_i \right) + \log_2\{1/(1-p_d)\}$$

where $\tilde{L}_{ave}$ denotes the average length of the prefix-processed code. When discrepancies between the average length of the compact codes and their entropies are denoted as d and $\tilde{d}$ for the reference compact code and the prefix-processed code respectively, $\tilde{L}_{ave}$ can be denoted as:

$$\tilde{L}_{ave} = L_{ave} - d + \tilde{d} + \log_2\{1/(1-P_d)\}. \quad \text{(Equation 16)}$$

From the Equations 2 and 16, the average length of the prefix-processed code can be expressed as a function of the parameter s as follows:

$$\tilde{L}_{ave} = L_{ave} - d + \tilde{d} + \log_2\{2^{s+1}/(2^{s+1} - 1)\}. \quad \text{(Equation 17)}$$

and $$\Delta L_{pre}(s) = \tilde{L}_{ave} - L_{ave} \quad \text{(Equation 18)}$$
$$= \log_2\{2^{s+1}/(2^{s+1} - 1)\} + \tilde{d} - d.$$

Considering $\tilde{d}-d$ is independent of the parameter s, the efficiency loss due to the dummy word $\Delta L_{pre}(s)$ is a monotonous decreasing function of s.

On the other hand, efficiency loss due to suffix processing can be expressed by the parameter t. The efficiency loss due to additional bits $\Delta L_{add}$ is given by:

$$\Delta L_{add} = \Delta L_{addsuffix} + \Delta L_{addmiddle} \quad \text{(Equation 19)}$$

where $\Delta L_{addsuffix}$ denotes the efficiency loss caused by additional bits inserted into the suffixes and $\Delta L_{addmiddle}$ denotes the efficiency loss caused by additional bits inserted into the middle of words.

From the process in the fourth processing part (13g) of the suffix processing unit 83, $\Delta L_{addsuffix}$ is given by:

$$\Delta L_{addsuffix}(t) = \sum_{i=1}^{\tilde{L}_{max}} \sum_{h=\text{last}(i+1)-w_i+1}^{\text{last}(i+1)} p(i+1, h) \times \quad \text{(Equation 20)}$$

$$(n_i + u_{i-t-1,t+1} - r_i) \leq \sum_{i=1}^{\tilde{L}_{max}} p(i+1, 1) \times (n_i - r_i + u_{i-t-1,t+1})$$

where $\tilde{L}_{max}$ is the maximum length of a suffix-processed code, last(i+1) is the codeword number at level i+1 which has the lowest occurrence probability at this level, $w_i = n_i + u_{i-t-1,t+1} - r_i$, and p(i+1,h) is the h-th highest occurrence probability for a codeword at level i+1. Since the number of nodes at level i−t−1 is given by $r_{i-t-1} - n_{i-t-1}$, $u_{i-t-1,t+1}$ is expressed as:

$$u_{i-t-1,t+1} = \max\left( r_{i-t-1} - n_{i-t-1} - \sum_{k=i-t}^{i-1} m_k, 0 \right). \quad \text{(Equation 21)}$$

Since $r_{i-t-1}$ and $n_{i-t-1}$, have no correlation with t, $u_{i-t-1,t+1}$ is a monotonous decreasing function of t. Therefore, $\Delta L_{addsuffix}$ is also a monotonous decreasing function of t.

From the process in the second and third processing parts (13e and 13f) of the suffix processing unit 83, $\Delta L_{addmiddle}$ is given by:

$$\Delta L_{addmiddle}(t, N) = \quad \text{(Equation 22)}$$

$$\sum_{i=1}^{\tilde{L}_{max}} \left\{ \text{Num}_{addmiddle}(t, N, i) \times \sum_{j=1}^{\text{Num}_{addmiddle}(t,N,i)} p(i, j) \right\}$$

where $\text{Num}_{addmiddle}(t,N,i)$ is the number of additional bits in the middle of words:

$$\text{Num}_{addmiddle}(t, N, i) = v(i) - \sum_{j=1}^{i+t-1} \text{Num}_{termleaf}(i, j) - \quad \text{(Equation 23)}$$

$$\sum_{j=i+t}^{i+N} \text{Num}_{addleaf}(i, j)$$

and v(i) is number of nodes which have a suffix of continuous "0" bits from level i, $\text{Num}_{termleaf}(i,j)$ is number of nodes which have a suffix of continuous "0" bits from level i and are terminated as leaves without additional bits at level j, $\text{Num}_{addleaf}(i,j)$ is number of nodes which have a suffix of continuous "0" bits from level i and are terminated as leaves with additional bits at level j, and p(i,j) is the occurrence probability summation of the node in which an additional bit is inserted. Since $\text{Num}_{addmiddle}(t,N,i)$ is a monotonous decreasing function of t and N, $\Delta L_{addmiddle}(t,N)$ is also a monotonous decreasing function of t and N.

From the Equations 18 and 20 to 22, the average length of the emulation-less code $\tilde{L}_{ave}$ is expressed as:

$$\tilde{L}_{ave}(s,t,N) = L_{ave} + \Delta L_{pre}(s) + \Delta L_{addsuffix}(t) +$$
$$\Delta L_{addmiddle}(t,N) \quad \text{(Equation 24)}$$

Considering the Equations 18, 20, 22 and 24 and the aforementioned Requirement 4 (s+t<N), the following Conclusions are obtained.

(Conclusion 1) Larger parameter s provides shorter average length of the emulation-less code $\tilde{L}_{ave}$.

(Conclusion 2) Larger parameter t provides shorter average length of the emulation-less code $\tilde{L}_{ave}$, (Conclusion 3) Longer unique word length N provides shorter average length of the emulation-less code $\tilde{L}_{ave}$.

(Conclusion 4) In certain codes, the average length of the emulation-less code $\tilde{L}_{ave}$ has a minimum value at the balance of the parameters when a constant N is given.

These conclusions are verified in the following description by using an example to provide actual parameters s, t and N.

length in the latter example are also indicated in Table 2. The efficiency loss with respect to Huffman code is as little as 0.04%.

Figure 10:
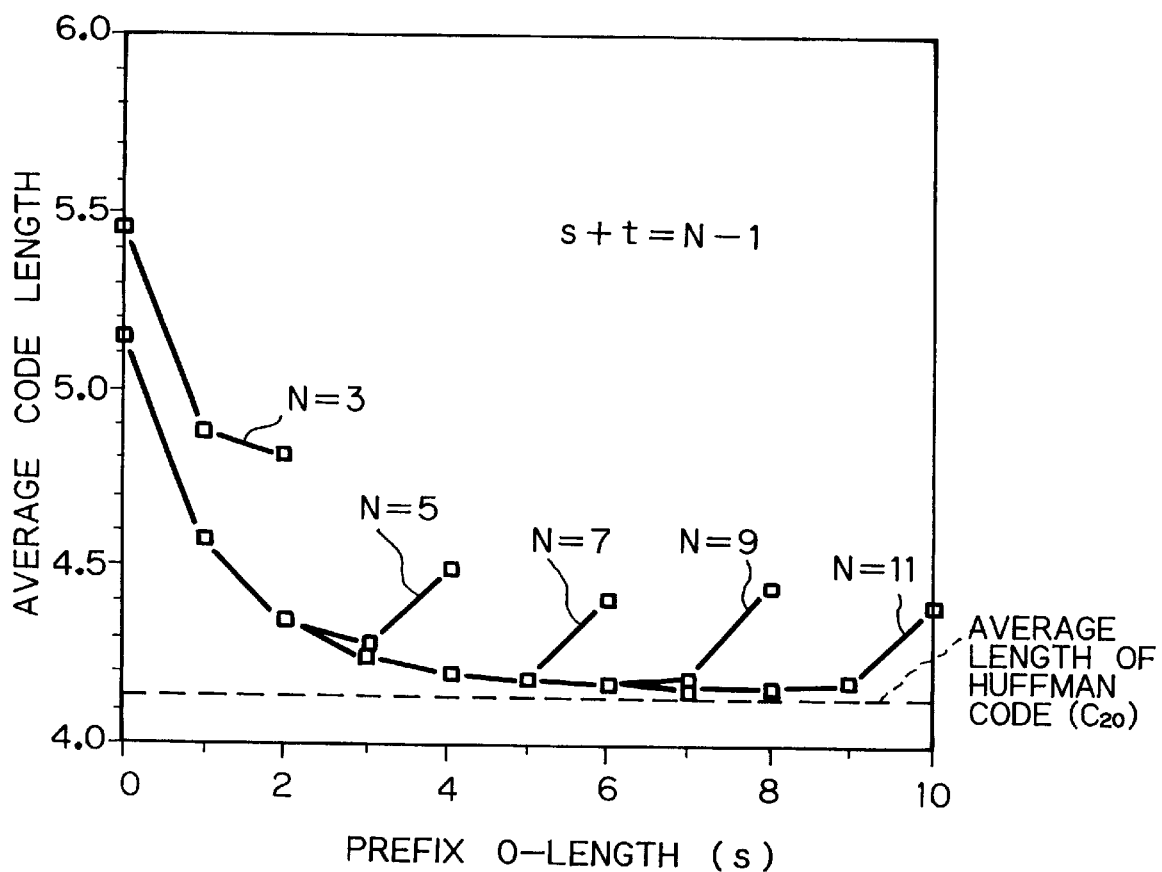
FIG. 10 illustrates parameter s (prefix 0-length) versus average code length characteristics with respect to emulation-less VLC.
Figure 11:
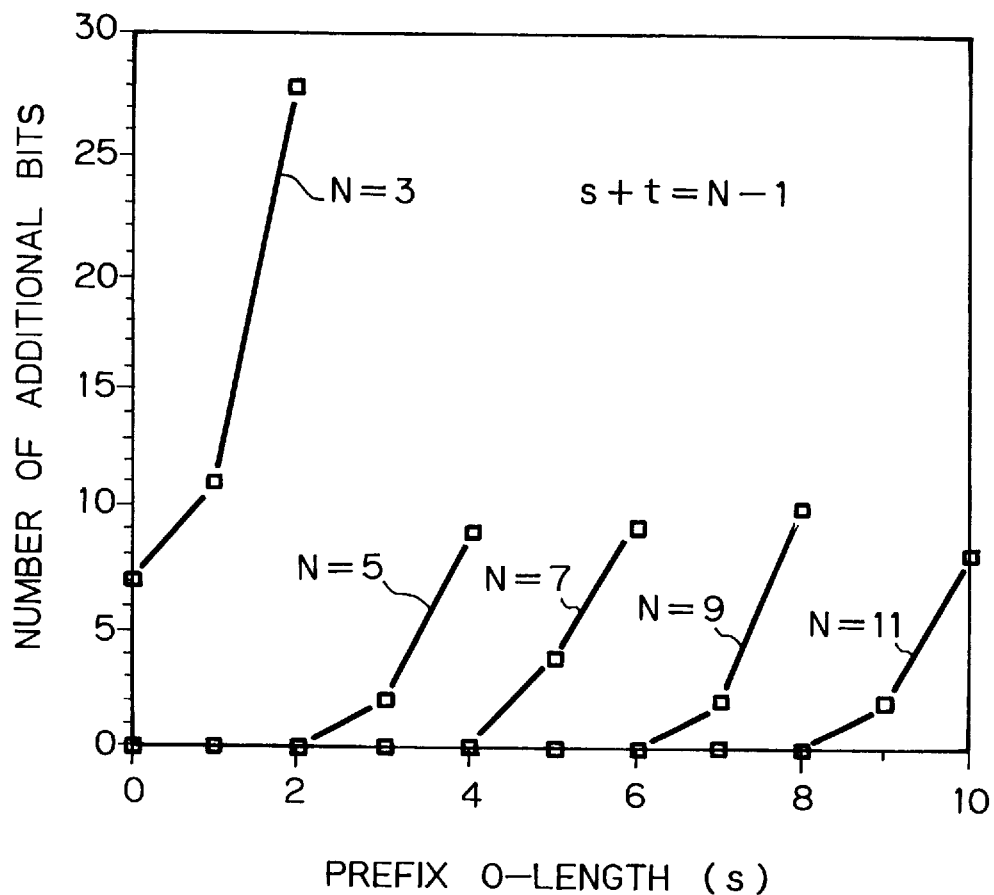
FIG. 11 illustrates parameter s (prefix 0-length) versus number of additional bits characteristics with respect to emulation-less VLC.

From FIGS. 10 and 11, the following can be verified.

(Verification 1) When s is small compared with N, larger s provides a shorter average code length, which corresponds to the aforementioned Conclusion 1.

(Verification 2) When s is near N or t is small compared with N, larger t provides a shorter average code length, which corresponds to the aforementioned Conclusion 2.

TABLE 2

| symbol | occurrence probability | Huffman code ($C_{20}$) | symbol | modified probability | emulation-less VLC ($C_{21}$) s = 3, t = 1, N = 5 | symbol | modified probability | emulation-less VLC ($C_{22}$) s = 8, t = 2, N = 11 |
|---|---|---|---|---|---|---|---|---|
| E | 0.1487858 | 001 | E | 0.1394867 | 010 | E | 0.1484952 | 100 |
| T | 0.0935415 | 110 | T | 0.0876951 | 110 | T | 0.0933588 | 110 |
| A | 0.0883373 | 0000 | A | 0.0828163 | 0010 | A | 0.0881648 | 0011 |
| O | 0.0724580 | 0100 | O | 0.0679293 | 0110 | O | 0.0723164 | 0001 |
| R | 0.0687216 | 0101 | R | 0.0644265 | 1010 | R | 0.0685874 | 0100 |
| N | 0.0649853 | 0110 | dummy | 0.0625000 | 0000 | N | 0.0648584 | 0010 |
| H | 0.0583133 | 1000 | N | 0.0609237 | 1110 | H | 0.0581994 | 0111 |
| I | 0.0564452 | 1001 | H | 0.0546687 | 0001 | I | 0.0563349 | 0110 |
| S | 0.0554776 | 1010 | I | 0.0529173 | 1011 | S | 0.0552695 | 1010 |
| D | 0.0437683 | 00010 | S | 0.0519165 | 1111 | D | 0.0436829 | 10111 |
| L | 0.0412330 | 00011 | D | 0.0410328 | 00111 | L | 0.0411524 | 11100 |
| U | 0.0276221 | 10110 | L | 0.0386559 | 00110 | U | 0.0275681 | 11111 |
| P | 0.0257539 | 10111 | U | 0.0258957 | 01110 | P | 0.0257036 | 01010 |
| F | 0.0245530 | 11100 | P | 0.0241443 | 10010 | F | 0.0245050 | 01011 |
| M | 0.0236189 | 11110 | F | 0.0230184 | 100011 | M | 0.0235728 | 11110 |
| C | 0.0208167 | 11111 | M | 0.0221427 | 100111 | C | 0.0207760 | 10110 |
| W | 0.0186816 | 011100 | C | 0.0195156 | 011110 | W | 0.0186451 | 000011 |
| G | 0.0152122 | 011101 | W | 0.0175140 | 100110 | G | 0.0151824 | 000010 |
| Y | 0.0152122 | 011110 | Y | 0.0142614 | 100010 | Y | 0.0151824 | 111010 |
| B | 0.0126768 | 011111 | G | 0.0142614 | 10000A1 | B | 0.0126520 | 000001 |
| V | 0.0116093 | 111011 | B | 0.0118845 | 10000A0 | V | 0.0115866 | 111011 |
| K | 0.0086736 | 1110100 | V | 0.0108837 | 0111110 | K | 0.0086567 | 0000001 |
| X | 0.0014678 | 11101011 | K | 0.0081315 | 01111110 | dummy | 0.0019531 | 000000000 |
| Q | 0.0008006 | 111010101 | X | 0.0013761 | 011111110 | X | 0.0014650 | 000000010 |
| J | 0.0008006 | 1110101000 | Q | 0.0007506 | 0111111110 | Q | 0.0007991 | 000000011 |
| Z | 0.0005338 | 1110101001 | J | 0.0007506 | 01111111111 | J | 0.0007991 | 0000000011 |
| — | — | — | Z | 0.0005004 | 01111111110 | Z | 0.0005327 | 0000000010 |
| average length | | 4.155725 | average length | | 4.276488 | average length | | 4.157193 |

A: additional bit "1"

The English Alphabet set has 26 symbols and the occurrence probabilities shown in Table 2. In this table, Huffman codes $C_{20}$ for reference obtained from the original occurrence probabilities are also shown.

Under a condition s+t<N of the Requirement 4, the average code length of emulation-less codes varies as shown in FIG. 10 when the parameters s and N change. FIG. 11 shows the change in the number of additional bits. Since it is advantageous for improving the code efficiency to increase the parameter t with satisfying the Requirement of s+t<N, t is determined in the following description as t=N−1−s.

As shown in FIG. 10, the minimum average code length is given at s=3 in case of a short unique word length N (N=5) considering hardware restriction. Modified occurrence probabilities and emulation-less codes $C_{21}$ of the symbols and of a dummy word as well as an average code length in this example for the short N are indicated in Table 2. The efficiency loss with respect to Huffman code is 2.91%. In case of a long N (N=11) for better code efficiency, the minimum average code length is given at s=8. Modified occurrence probabilities and emulation-less codes $C_{22}$ of the symbols and of a dummy word as well as an average code (Verification 3) When N≧5, the minimum code length is given by a balance of s and t at each N, which corresponds to the aforementioned Conclusion 4.

(Verification 4) When N is large, more selections of s provides a short average code length close to that of the reference code $C_{20}$.

(Verification 5) When N≧3, additional bits are not required for s≦N−3 or t≧2, which corresponds to the Equations 20 and 23.

Figure 12:
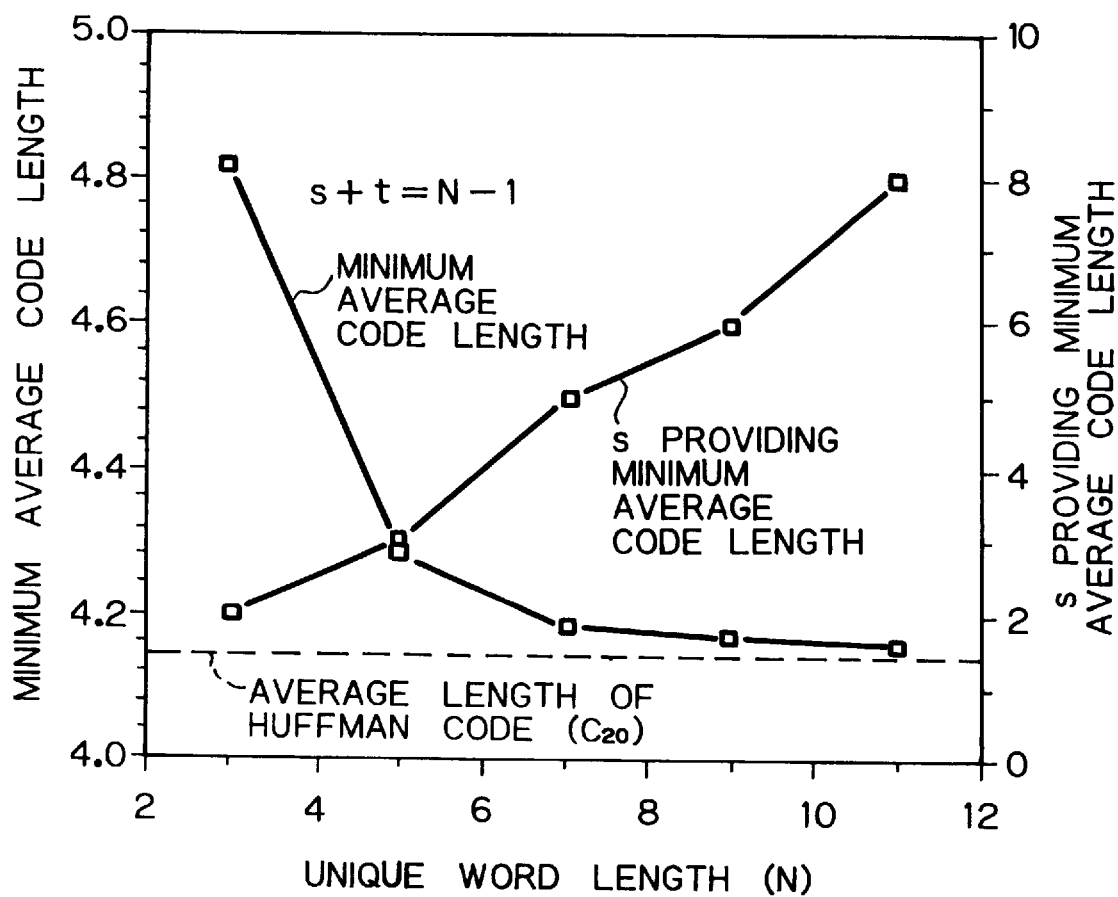
FIG. 12 illustrates unique word length N versus minimum average code length and parameter s providing minimum average code length characteristics with respect to emulation-less VLC.

FIG. 12 shows the minimum average length and the value of s which gives this minimum average length when N changes. From FIG. 12, the following can be verified.

(Verification 6) Larger N gives a shorter average code length, and it approaches the average length of the reference code $C_{20}$ which corresponds also to the aforementioned Conclusion 3.

(Verification 7) The parameter s providing the minimum average code length is given by N−3≦s≦N−1 or 0≦t≦2.

Considering the above results, the parameters should be selected to improve the coding efficiency so that:

(A) N to be as long as the hardware will allow is selected, (B) s to be as long as possible without requiring additional bits is selected.

Figure 13:
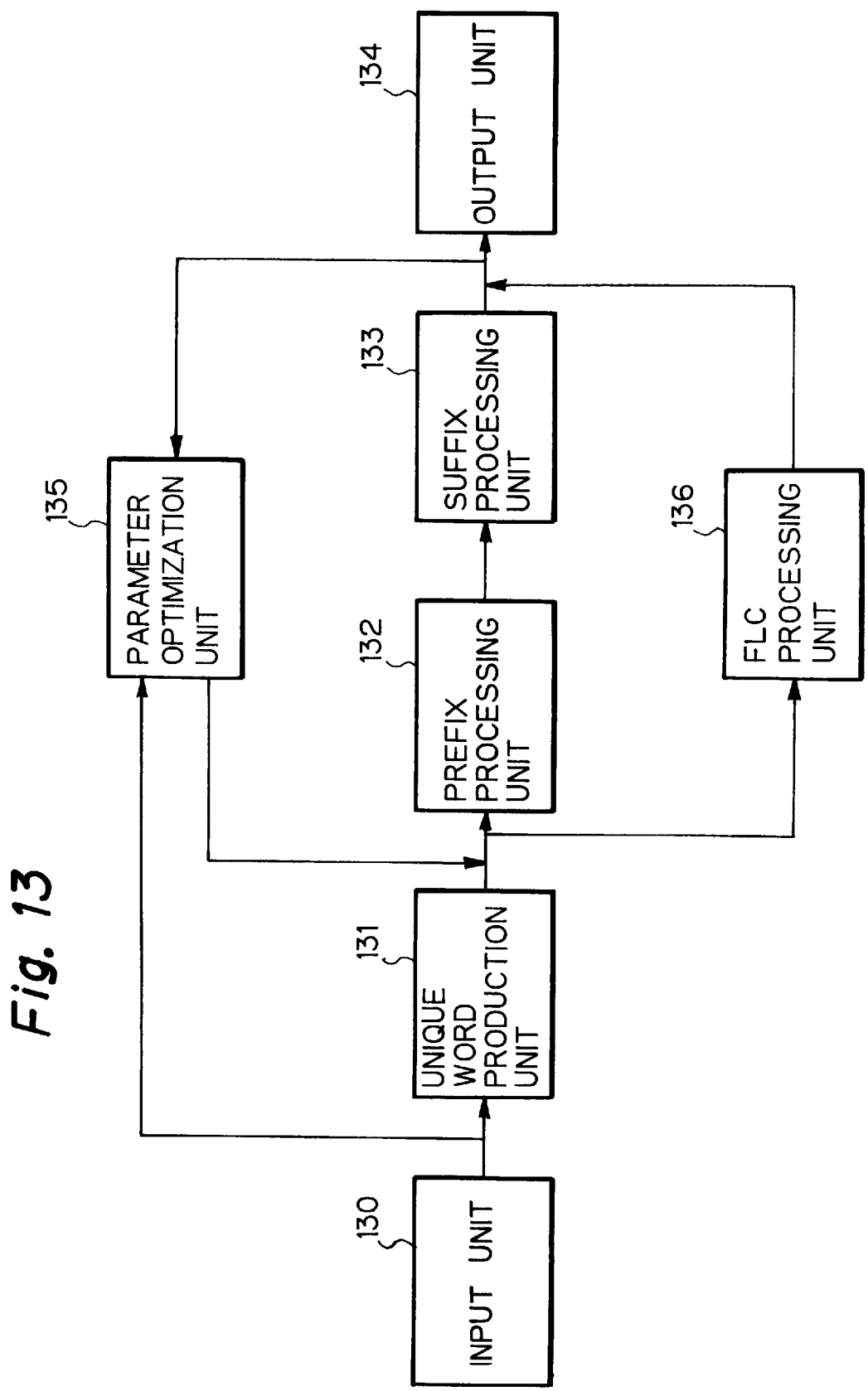
FIG. 13 is a block diagram schematically showing a further embodiment of a VLC construction apparatus according to the present invention.

FIG. 13 schematically shows a further embodiment of a VLC construction apparatus according to the present invention.

In the figure, reference numeral 130 denotes an input unit for receiving number of symbols n, an occurrence probability of each symbol $P_i$, a unique word length N (N is a natural number more than 1), and number of kinds of the unique word E. To this input unit 130, a unique word production unit 131, a prefix processing unit 132, a suffix processing unit 133 and an output unit 134 for providing a constructed VLC and a unique word are sequentially connected in this order. A parameter optimization unit 135 is connected to receive outputs from the suffix processing unit 133 and the input unit 130 and to provide the optimized parameter s and t to the prefix processing unit 132. In this embodiment, the VLC construction apparatus additionally has a FLC processing unit 136 connected in parallel with the prefix processing unit 132 and the suffix processing unit 133. Configurations of the unique word production unit 131, the prefix processing unit 132, the suffix processing unit 133 and the parameter optimization unit 135 are the same as those of the similar units in the embodiment shown in FIG. 8.

Figure 14:
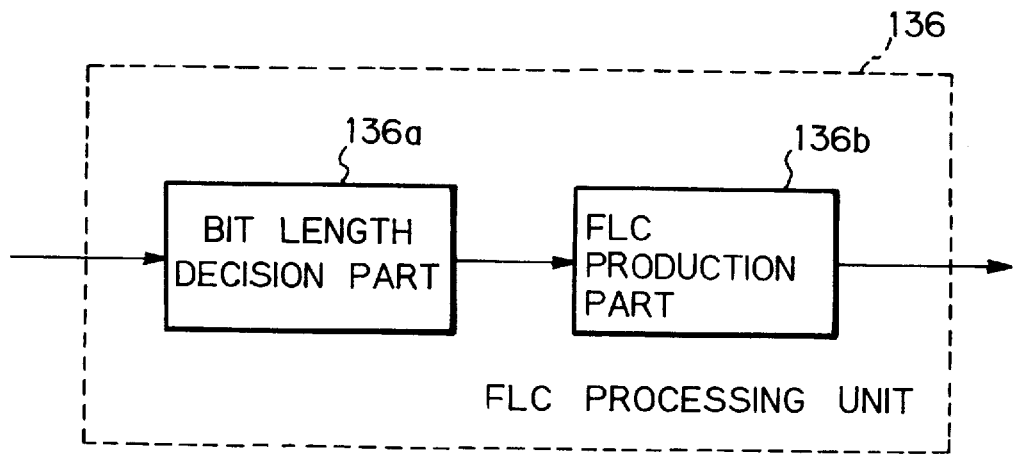
FIG. 14 is a block diagram schematically showing a configuration example of a fixed length code processing unit according to the embodiment of FIG. 8.

As shown in FIG. 14, the FLC processing unit 136 has a bit length decision part 136a for deciding a fixed bit length M of FLCs, and an FLC production part 136b for creating FLCs which have the decided bit length M and satisfy requirements for emulation-less FLCs.

The bit length decision part 136a decides the bit length M from number of symbols n, a unique word length N and parameters s and t to satisfy following equation:

$$f(M-1) < n \leq f(M) \quad \text{(Equation 25)}$$

where $$f(M) = 2^M - 2^{M-s-1} - 2^{M-t-1} + 2^{M-s-t-2} - Z(M-s-t-2, N),$$

and Z(p,q) is a function that represents the number of codewords of length p that includes "0" continuities equal to or longer than q bits. When M−s−1<1, it is considered as M−s−1=1. When M−t−1<1, it is considered as M−t−1=1. When M−s−t−2<1, it is considered as M−s−t−2=1.

The FLC production part 136b produces FLCs with thus decided bit length M satisfying requirements to prevent FLCs from emulating the unique word. The requirements are as follows.

(Requirement 1') Codewords consisting of only "0" bits shall be prohibited.

(Requirement 2') Codewords with a length of continuous "0" bits in a prefix longer than s shall be prohibited.

(Requirement 3') Codewords with a length of continuous "0" bits in a suffix longer than t shall be prohibited.

(Requirement 4') s+t<N (Requirement 5') Codewords with a length of continuous "0" bits in the middle longer than N shall be prohibited.

The VLC construction apparatus of this embodiment can be applied to a signal transmission system using both VLCs and FLCs. The VLCs are constructed in the prefix processing unit 132 and the suffix processing unit 133, while the FLCs without prohibited codewords are constructed in the FLC processing unit 136. Additional bits are not allowed for FLCs to maintain the length of each codeword.

Figure 15:
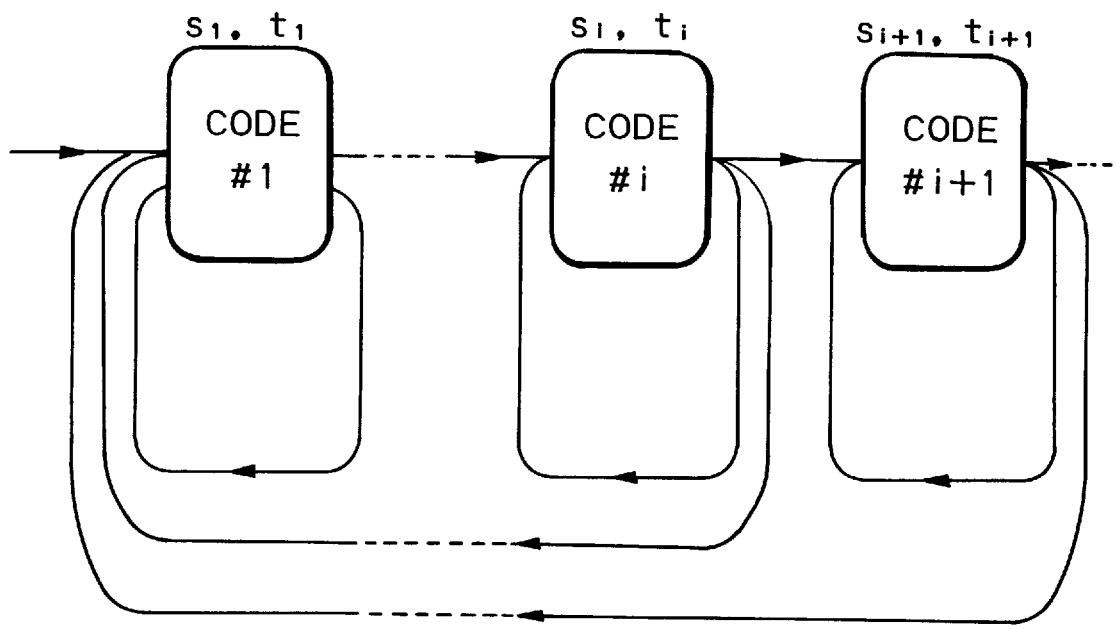
FIG. 15 is a block diagram schematically showing a VLC transmission system with multiple code and multiple loop.

The embodiment is easily applicable to more general transmission systems with multiple VLCs / FLCs and multiple loops. In such systems, the parameters s and t of each code and N is determined considering the transmission procedure. For example, in the transmission system with multiple codes and multiple loops shown in FIG. 15, emulation-less VLC and FLC for each code denoted as #1 where $1 \leq i \leq M$ is obtained considering the following requirements in addition to the aforementioned Requirements 1 to 5 and Requirements 1' to 5' with s and t replaced by $s_i$ and $t_i$ (restriction parameters with respect to i-th kind of code), respectively.

(Requirement 6) $s_{i+1} + t_i < N$ (Requirement 7) $s_1 + t_i < N$

Each VLC can be created by the same processes with parameters satisfying the Requirements 1 to 7, whereas each FLC can be obtained by considering the Requirements 1' to 5' and the Requirements 6 and 7.

The parameters are optimized considering total transmission efficiency. The length of the unique word N also depends on the recognition capability of 0-length by hardware. The total transmission efficiency $L_{total}$ is given by using the average length function of the individual codes:

$$L_{total} = \sum_{i=1}^{M} q_i \times \tilde{L}_{ave}(s_i, t_i, N) \quad \text{(Equation 26)}$$

where $q_i$ is the probability of code #i in the sequence of codes.

Many widely different embodiments of the present invention may be constructed without departing from the spirit and scope of the present invention. It should be understood that the present invention is not limited to the specific embodiments described in the specification, except as defined in the appended claims.

What is claimed is:

1. An apparatus for constructing a variable length code comprising:

means for producing a unique word consisting of continuous N "0" bits (N is a natural number more than 1);

a prefix processing means for producing a codeword including at least one "1" bit, the prefix of said codeword having continuous "0" bits with a length equal to or shorter than s (s is a natural number or zero); and a suffix processing means for modifying a bit pattern of the produced codeword from the prefix processing means so that the suffix of the codeword has continuous "0" bits with a bit length equal to or shorter than t (t is a natural number or zero), that a bit length of continuous "0" bits in the codeword is shorter than N, and that s+t<N is satisfied.

2. The apparatus as claimed in claim 1, wherein said prefix processing means consists of means for producing a variable length code by introducing a dummy word consisting of only continuous s+1 "0" bits.

3. The apparatus as claimed in claim 2, wherein said prefix processing means includes means for producing the dummy word with an occurrence probability of $P_d$, means for modifying an occurrence probability of each word $P_i$ in accordance with the occurrence probability $P_d$ to provide a modified occurrence probability $\tilde{P}_i$, and means for deciding bit patterns of all the codewords by using a variable length code algorithm based upon the occurrence probability $P_d$ and the modified occurrence probability $\tilde{P}_i$.

4. The apparatus as claimed in claim 1, wherein said suffix processing means includes means for measuring a suffix status of each codeword, and means for providing a codeword with no additional bit when the continuous length of "0" bits in the suffix of the codeword is equal to or shorter than t and also the codeword does not have consecutive N−1 "0" bits.

5. The apparatus as claimed in claim 4, wherein said suffix processing means includes means for inserting additional bits of "1" after consecutive "0" bits when the continuous length of "0" bits in the middle of the codeword is N−1 "0" bits.

6. The apparatus as claimed in claim 4, wherein said suffix processing means further includes means for inserting additional bits of "1" when the continuous length of "0" bits in the suffix of the codeword is longer than t.

7. The apparatus as claimed in claim 4, wherein said suffix processing means consists of means for measuring parameters expressed in a binary tree and means for modifying the bit pattern of the produced codeword.

8. The apparatus as claimed in claim 1, wherein said apparatus further includes a parameter optimization means for modifying parameters s and t to an optimized values which improve code efficiency.

9. The apparatus as claimed in claim 8, wherein said parameter optimization means includes means for measuring an average code length of variable length codes output from said suffix processing means and number of additional bits inserted by the suffix processing means, and means for modifying the parameters s and t according to the measured average code length and number of additional bits.

10. The apparatus as claimed in claim 1, wherein said apparatus further includes means for producing a fixed length code in which a codeword includes at least one "1" bit, the prefix of the codeword has continuous "0" bits with a length equal to or shorter than s, the suffix of the codeword has continuous "0" bits with a bit length equal to or shorter than t, a bit length of continuous "0" bits in the codeword is shorter than N, and s+t<N is satisfied.

* * * * *